(12) United States Patent
Deng et al.

(10) Patent No.: US 12,250,847 B2
(45) Date of Patent: Mar. 11, 2025

(54) DISPLAY SUBSTRATE, MANUFACTURING METHOD THEREOF AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Wei Deng, Beijing (CN); Lei Deng, Beijing (CN); Kangguan Pan, Beijing (CN); Huimin Cao, Beijing (CN); Yue He, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 833 days.

(21) Appl. No.: 17/289,068

(22) PCT Filed: Aug. 10, 2020

(86) PCT No.: PCT/CN2020/108139
§ 371 (c)(1),
(2) Date: Apr. 27, 2021

(87) PCT Pub. No.: WO2021/031898
PCT Pub. Date: Feb. 25, 2021

(65) Prior Publication Data
US 2022/0013601 A1  Jan. 13, 2022

(30) Foreign Application Priority Data
Aug. 20, 2019  (CN) .......................... 201910769452.9

(51) Int. Cl.
*H01L 29/78* (2006.01)
*H10K 59/12* (2023.01)
(Continued)

(52) U.S. Cl.
CPC ............. *H10K 59/12* (2023.02); *H10K 59/60* (2023.02); *H10K 71/00* (2023.02); *H10K 59/1201* (2023.02)

(58) Field of Classification Search
CPC ......... H01L 51/52; H01L 51/56; H01L 27/32; H10K 59/12; H10K 59/60; H10K 71/00;
(Continued)

(56) References Cited

U.S. PATENT DOCUMENTS

2009/0134399 A1* 5/2009 Sakakura ............... H10K 59/12
313/504
2013/0153876 A1* 6/2013 Minami ............... H10K 59/352
257/40

(Continued)

FOREIGN PATENT DOCUMENTS

CN 104867958 A 8/2015
CN 106409867 A 2/2017
(Continued)

OTHER PUBLICATIONS

International Search Report received for PCT Patent Application No. PCT/CN2020/108139, mailed on Nov. 13, 2020, 5 pages (2 pages of English Translation and 3 pages of Original Document).

(Continued)

*Primary Examiner* — Sheikh Maruf
(74) *Attorney, Agent, or Firm* — Calfee, Halter & Griswold LLP (57) ABSTRACT

The present disclosure provides a display substrate, a manufacturing method thereof, and a display device. The display substrate includes: a base substrate including a display (Continued)

region and an opening region adjacent to each other; and at least one isolation wall extending along a boundary between the display region and the opening region. Each of the at least one isolation wall includes at least one isolation structure, and each of the at least one isolation structure includes: a first layer on a side of the base substrate; and a second layer on a side of the first layer away from the base substrate; and the orthographic projection of the first layer on the base substrate is within the orthographic projection of the second layer on the base substrate. The isolation wall effectively disconnects the organic light emitting material, prevents moisture from entering the display region, and improves the display quality.

12 Claims, 5 Drawing Sheets

(51) Int. Cl.
  *H10K 59/60* (2023.01)
  *H10K 71/00* (2023.01)
(58) Field of Classification Search
  CPC ............ H10K 59/1201; H10K 50/844; H10K 59/124; H10K 59/65; H10K 50/84; H04M 2250/12; H04M 1/0266; H04M 1/026
  USPC .......................................................... 257/40
  See application file for complete search history.

(56) References Cited

U.S. PATENT DOCUMENTS

| | | | | |
|---|---|---|---|---|
| 2013/0234123 A1* | 9/2013 | Hirakata | ............... | H10K 50/868 257/40 |
| 2014/0291641 A1* | 10/2014 | Negishi | ................ | H10K 59/131 257/40 |
| 2015/0060821 A1* | 3/2015 | Furuie | .................... | H10K 50/86 257/40 |
| 2015/0060822 A1* | 3/2015 | Kamiya | ............... | H10K 50/844 257/40 |
| 2015/0069375 A1* | 3/2015 | Yokoyama | ........... | H10K 59/873 257/40 |
| 2015/0162394 A1* | 6/2015 | Tokuda | ................ | H10K 59/353 257/40 |
| 2015/0179725 A1* | 6/2015 | Kuji | .................... | H10K 50/8426 257/40 |
| 2015/0221893 A1* | 8/2015 | Teraguchi | ............ | H10K 59/124 438/35 |
| 2015/0236297 A1* | 8/2015 | Hong | .................... | H10K 59/124 257/40 |
| 2015/0279912 A1* | 10/2015 | Negishi | .............. | H10K 50/8426 257/40 |
| 2015/0340654 A1* | 11/2015 | Kato | .................. | H10K 59/1216 257/40 |
| 2016/0111688 A1* | 4/2016 | Lee | ......................... | H10K 71/00 438/34 |
| 2016/0181340 A1* | 6/2016 | Furuie | .................. | H10K 59/124 257/40 |
| 2017/0031323 A1* | 2/2017 | Kim | ..................... | H10K 59/1213 |
| 2017/0040396 A1* | 2/2017 | Li | ......................... | H10K 50/824 |
| 2017/0236882 A1* | 8/2017 | Matsunaga | .......... | H10K 59/873 257/40 |
| 2018/0006268 A1* | 1/2018 | Hong | .................... | H10K 59/131 |
| 2019/0229177 A1* | 7/2019 | Kim | ..................... | G09G 3/3233 |
| 2019/0252475 A1* | 8/2019 | Sung | ....................... | H04N 23/57 |
| 2019/0333972 A1 | 10/2019 | Ding et al. | | |
| 2019/0363276 A1* | 11/2019 | Li | ........................... | H10K 50/86 |
| 2020/0168683 A1* | 5/2020 | Son | ....................... | H10K 77/10 |
| 2020/0220098 A1* | 7/2020 | Tsai | ....................... | H10K 50/11 |
| 2020/0295102 A1* | 9/2020 | Qin | ........................ | H10K 71/00 |
| 2021/0005683 A1* | 1/2021 | Sung | ..................... | H10K 50/86 |
| 2021/0013293 A1* | 1/2021 | Hao | ..................... | H10K 59/131 |
| 2021/0028249 A1* | 1/2021 | Ding | ................... | H01L 27/1288 |
| 2021/0083226 A1* | 3/2021 | Okabe | ................. | H10K 50/844 |
| 2021/0098556 A1* | 4/2021 | Jang | ..................... | H10K 59/123 |
| 2021/0098737 A1* | 4/2021 | Pang | .................... | H10K 59/126 |
| 2021/0210727 A1* | 7/2021 | Fukagawa | ............ | H10K 50/852 |
| 2022/0123261 A1* | 4/2022 | Lee | ....................... | H10K 50/844 |
| 2022/0317806 A1* | 10/2022 | Fan | ........................ | G06F 3/0412 |
| 2022/0320210 A1* | 10/2022 | Tang | .................. | H01L 27/1292 |
| 2022/0328568 A1* | 10/2022 | Yu | ........................ | H10K 59/131 |
| 2023/0026398 A1* | 1/2023 | Kim | ..................... | H10K 59/124 |

FOREIGN PATENT DOCUMENTS

| | | |
|---|---|---|
| CN | 107452894 A | 12/2017 |
| CN | 108493228 A | 9/2018 |
| CN | 108666347 A | 10/2018 |
| CN | 109671870 A | 4/2019 |
| CN | 109801956 A | 5/2019 |
| CN | 109802052 A | 5/2019 |
| CN | 109920818 A | 6/2019 |
| CN | 109935621 A | 6/2019 |
| CN | 110265583 A | 9/2019 |
| CN | 110444690 A | 11/2019 |
| WO | 2020/098204 A1 | 5/2020 |

OTHER PUBLICATIONS

Office Action received for Chinese Patent Application No. 201910769452.9, mailed on Feb. 3, 2021, 20 pages (10 pages of English Translation and 10 pages of Office Action).

Office Action received for Chinese Patent Application No. 201910769452.9, mailed on Sep. 8, 2021, 11 pages (5 pages of English Translation and 6 pages of Office Action).

* cited by examiner

DISPLAY SUBSTRATE, MANUFACTURING METHOD THEREOF AND DISPLAY DEVICE

RELATED APPLICATION

The present application is a 35 U.S.C. 371 national stage application of PCT International Application No. PCT/CN2020/108139, filed on Aug. 10, 2020, which claims the benefit of Chinese Patent Application No. 201910769452.9 filed on Aug. 20, 2019, the entire disclosure of which is incorporated herein by reference.

TECHNICAL FIELD

The present disclosure relates to the field of display technology, specifically to a display substrate, a manufacturing method thereof and a display device.

BACKGROUND

As the screen-to-body ratio of display devices continues to increase, perforated screens have become an important solution to increase the screen-to-body ratio, especially an OLED perforated screen. During the manufacturing process of a perforated screen, the organic light emitting material on the periphery of the opening is prone to absorb moisture in the environment. The absorbed moisture will further penetrate into the display region of the screen via the organic light emitting material, resulting in deficiencies such as dark spots.

SUMMARY

According to an aspect of the present disclosure, there is provided a display substrate, comprising a base substrate comprising a display region and an opening region adjacent to each other; and at least one isolation wall extending along a boundary between the display region and the opening region; wherein each of the at least one isolation wall comprises at least one isolation structure, and each of the at least one isolation structure comprises: a first layer on a side of the base substrate; and a second layer on a side of the first layer away from the base substrate. An orthographic projection of the first layer on the base substrate is within an orthographic projection of the second layer on the base substrate.

In some embodiments, the display region comprises a thin film transistor structure, the thin film transistor structure being on a first material layer and a second material layer; the first layer is composed of a portion of the first material layer corresponding to the boundary, and the second layer is composed of a portion of the second material layer corresponding to the boundary.

In some embodiments, the first material layer and the second material layer have different etching properties.

In some embodiments, the first material layer is a $SiN_x$ layer, and the second material layer is a $SiO_x$ layer.

In some embodiments, each of the at least one isolation wall comprises at least two isolation structures stacked along a direction perpendicular to a surface of the base substrate.

In some embodiments, the display substrate further comprises an organic light emitting material layer, the organic light emitting material layer being discontinuous on a side surface of the at least one isolation wall.

According to another aspect of the present disclosure, there is provided a display device comprising the display substrate described above.

In some embodiments, the display device further comprises a photosensitive element, the photosensitive element corresponding to the opening region.

According to another aspect of the present disclosure, there is provided a method of manufacturing a display substrate, comprising: providing a base substrate, the base substrate comprising a display region and an opening region adjacent to each other; fabricating a thin film transistor structure; and performing an etching process to form at least one isolation wall extending along a boundary between the display region and the opening region; wherein each of the at least one isolation wall comprises at least one isolation structure, and each of the at least one isolation structure comprises: a first layer on a side of the base substrate; and a second layer on a side of the first layer away from the base substrate; an orthographic projection of the first layer on the base substrate being within an orthographic projection of the second layer on the base substrate.

In some embodiments, the step of fabricating the thin film transistor structure at least comprises: depositing a first material layer and a second material layer on the base substrate. Said performing an etching process comprises: performing the etching process simultaneously on a portion of the first material layer corresponding to the boundary and a portion of the second material layer corresponding to the boundary, so that the portion of the first material layer corresponding to the boundary is patterned as the first layer, and the portion of the second material layer corresponding to the boundary is patterned as the second layer.

In some embodiments, the first material layer and the second material layer have different etching properties.

In some embodiments, the first material layer is a $SiN_x$ layer, and the second material layer is a $SiO_x$ layer.

In some embodiments, prior to performing the etching process, the method further comprises: forming a protective layer pattern, the protective layer pattern comprising a first portion and a second portion, a gap existing between the first portion and the second portion, an orthographic projection of the first portion on the base substrate covering the display region, an orthographic projection of the second portion on the base substrate covering an orthographic projection of the isolation wall on the base substrate; performing a pre-etching process on the portion of the first material layer corresponding to the boundary and the portion of the second material layer corresponding to the boundary, thereby forming at least one prefabricated wall extending along the boundary between the display region and the opening region; wherein each of the at least one prefabricated wall comprises a substantially flat first side surface and a substantially flat second side surface.

In some embodiments, the pre-etching process and the etching process are both dry etching processes.

In some embodiments, the pre-etching process uses $CF_4$ and $O_2$ as etching gases; the etching process uses $SF_6$ and $O_2$ as etching gases.

In some embodiments, after performing the etching process, the method further comprises: removing the protective layer pattern; and forming an organic light emitting material layer on the display substrate, the organic light emitting material layer being discontinuous on a side surface of the at least one isolation wall.

BRIEF DESCRIPTION OF THE DRAWINGS

In order to more clearly illustrate the technical solutions in embodiments of the present disclosure, the drawings to be used for description of the embodiments will be briefly introduced below. Obviously, the drawings described below are only some embodiments of the present disclosure. A person having an ordinary skill in the art may also obtain other drawings based on these drawings without spending inventive efforts.

DETAILED DESCRIPTION

The technical solutions in embodiments of the present disclosure will be described clearly and comprehensively below in conjunction with the drawings in the embodiments of the present disclosure. Obviously, the described embodiments are only part of the embodiments of the present disclosure, rather than all of them. All other embodiments obtained by a person having an ordinary skill in the art based on the embodiments of the present disclosure without spending inventive efforts fall within the protection scope of the present disclosure.

Figure 1:
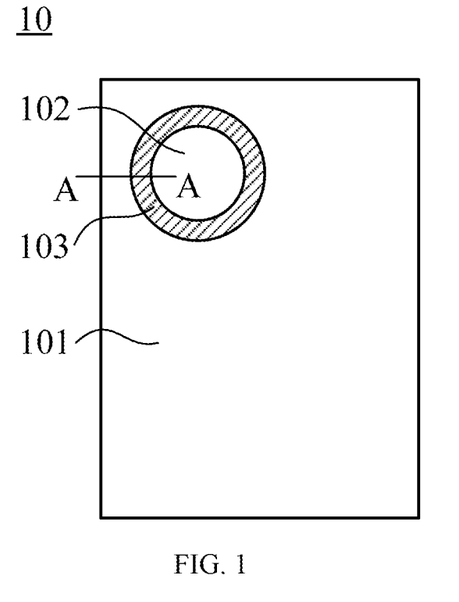
FIG. 1 is a schematic top view of a display substrate according to an embodiment of the present disclosure.
Figure 3:
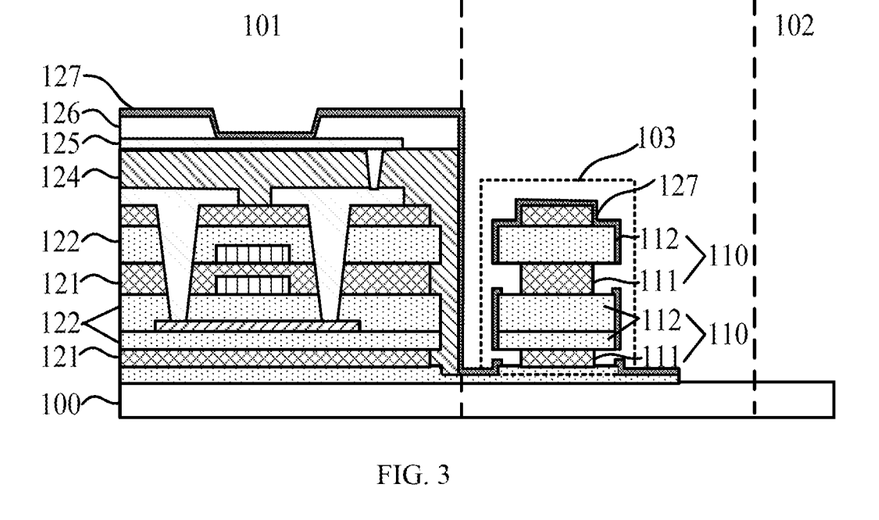
FIG. 3 is a schematic sectional view of the display substrate in FIG. 1 taken along line A-A.

According to an aspect of the present disclosure, there is provided a display substrate. FIG. 1 is a schematic top view of a display substrate 10 according to an embodiment of the present disclosure. The display substrate 10 includes: a base substrate, including a display region 101 and an opening region 102 adjacent to each other; and at least one isolation wall 103 extending along a boundary between the display region and the opening region, and one isolation wall is schematically shown in FIG. 1. FIG. 3 is a schematic sectional view of the display substrate in FIG. 1 taken along line AA. The isolation wall 103 includes at least one isolation structure 110. FIG. 3 schematically shows two isolation structures 110, and each isolation structure 110 includes: a first layer 111 located on a side of the base substrate 100; and a second layer 112 located on a side of the first layer 111 away from the base substrate 100. The orthographic projection of the first layer 111 on the base substrate 100 is located within the orthographic projection of the second layer 112 on the base substrate 100.

Referring to FIG. 3, the display region 101 includes a thin film transistor structure that is located on a first material layer 121 and a second material layer 122. The first layer 111 of the isolation structure 110 may be composed of a portion of the first material layer 121 corresponding to the boundary, and the second layer 112 of the isolation structure 110 may be composed of a portion of the second material layer 122 corresponding to the boundary. That is, the isolation structure may be formed by using multiple inorganic dielectric layers stacked when fabricating the thin film transistor structure, and there is no need to prepare additional material layers.

The first material layer and the second material layer have different etching properties. For example, in some embodiments, the first material layer may be a $SiN_x$ layer, and the second material layer may be a $SiO_x$, layer. $SiN_x$ and $SiO_x$ are two kinds of dielectric materials commonly used in a thin film transistor structure. In the case of performing ion beam etching using $SF_6$ and $O_2$ as the etching gases, the etching rates of $SiN_x$ and $SiO_x$, are significantly different, which is conducive to the formation of the required isolation structure. Of course, the first material layer and the second material layer may also be other dielectric materials, such as $SiN_xO_y$, as long as the first material layer and the second material layer have different etching rates under a certain etching method, and can form the first layer and the second layer of the isolation structure.

The display substrate provided by the present disclosure has the isolation wall as described above. When evaporation of an organic light emitting material is performed subsequently, the isolation structure of the isolation wall can disconnect the organic light emitting material, so that the organic light emitting material layer is discontinuous on the side surface of the isolation wall, which prevents moisture from entering the display region via the organic light emitting material layer and causing deficiencies such as black spots, thereby ensuring the display quality and increasing the product yield.

Each isolation wall may include a plurality of isolation structures stacked along a direction perpendicular to the surface of the base substrate. For example, two isolation structures 110 are shown in FIG. 3, which can more effectively disconnect the organic light emitting material layer.

For the isolation structure 110 in the lower part of FIG. 3, the second layer 112 corresponds to the two layers in the thin film transistor structure. The two layers may be material layers with different functions, but both are made of the second material. Thus, these two layers can be collectively referred to as the second material layer. Similarly, in other embodiments, the first layer may also be composed of more than one functional layer. This is not specifically limited in the present disclosure, as long as the isolation structure can be formed.

It is to be noted that the specific shape of the opening region may be any regular or irregular shape such as a circle, an ellipse, a trapezoid, a drop shape, etc., which is not limited in the present disclosure. Accordingly, the isolation wall extending along the boundary between the display region and the opening region may have different shapes. The isolation wall shown in FIG. 1 is annular, which is only schematic and does not represent a limitation to the present disclosure.

Figure 2:
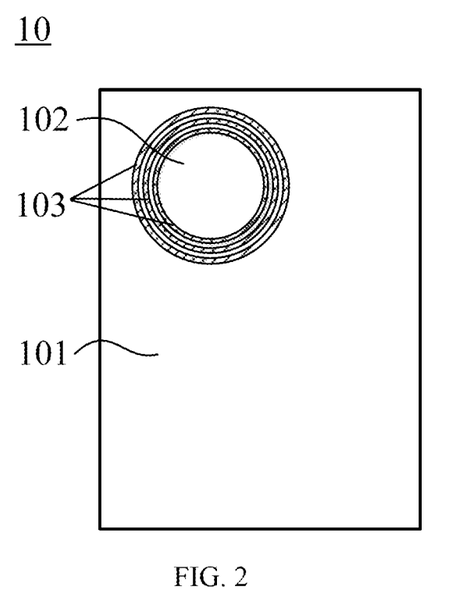
FIG. 2 is a schematic top view of a display substrate according to another embodiment of the present disclosure.

Since the thickness of each dielectric layer in the thin film transistor is limited, the thickness of the first layer of the isolation structure is also limited. During the evaporation of the organic light emitting material, the organic light emitting material layer may not be disconnected completely at a certain place. In some embodiments, in order to further ensure that the moisture passage is blocked, the display substrate may comprise a plurality of isolation walls. Taking an annular isolation wall as an example, the plurality of isolation walls may be arranged as shown in FIG. 2.

Figure 4:
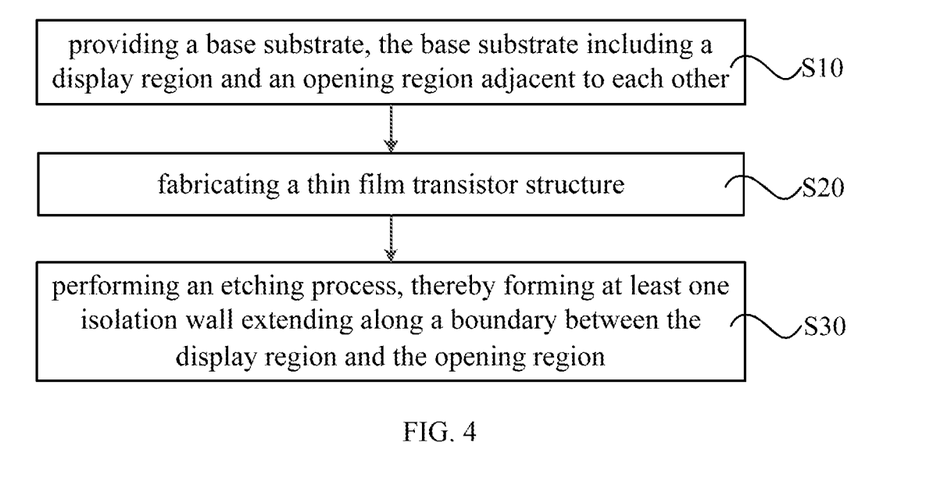
FIG. 4 is a flow chart of a method of manufacturing a display substrate according to an embodiment of the present disclosure.

According to another aspect of the present disclosure, there is provided a method of manufacturing a display substrate. FIG. 4 is a flow chart of a method of manufacturing a display substrate according to an embodiment of the present disclosure. The method includes: S10: providing a base substrate, the base substrate including a display region and an opening region adjacent to each other; S20: fabricating a thin film transistor structure; and S30: performing an etching process, thereby forming at least one isolation wall extending along a boundary between the display region and the opening region. As shown in FIG. 3, each of the at least one isolation wall 103 includes at least one isolation structure 110, and each of the at least one isolation structure 110 includes: a first layer 111 located on a side of the base substrate 100; and a second layer 112 located on a side of the first layer 111 away from the base substrate 100. The orthographic projection of the first layer 111 on the base substrate 100 is located within the orthographic projection of the second layer 112 on the base substrate 100.

Figure 5:
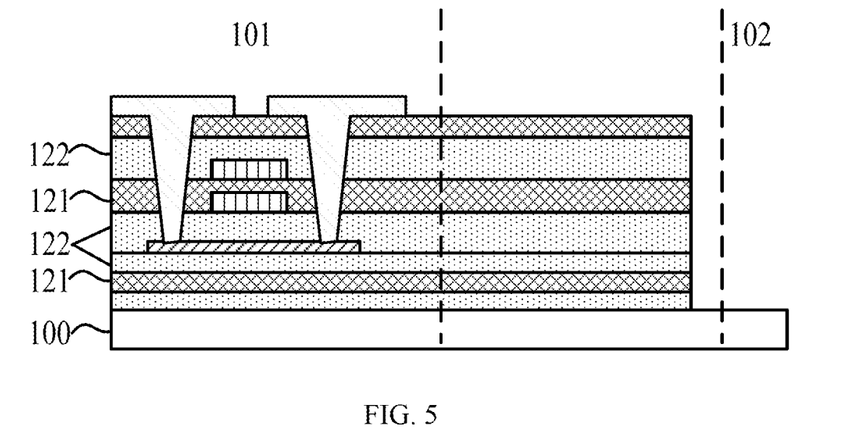
FIGS. 5-9 are schematic structural views illustrating specific steps for manufacturing a display substrate according to an embodiment of the present disclosure.

In some embodiments, as shown in FIG. 5, the step of fabricating the thin film transistor structure includes: fabricating a barrier layer, a first buffer layer, a second buffer layer, an active layer, a first gate insulating layer, a first gate, a second gate insulating layer, a second gate, a first interlayer dielectric layer, a second interlayer dielectric layer, a source/drain, etc. successively on the base substrate. The first buffer layer and the second gate insulating layer may be a first material layer 121, and the second buffer layer, the first gate insulating layer and the first interlayer dielectric layer may be a second material layer 122. The first material layer may be, for example, a $SiN_x$ layer, and the second material layer may be, for example, a $SiO_x$ layer.

In some embodiments, dry etching is used to perform an etching process on $SiN_x$ and $SiO_x$.

Dry etching forms plasms by dissociating gas, and performs etching by means of physical or chemical reactions between the plasmas and film layers being etched. The etching rates can be controlled by adjusting etching conditions (air pressure, radio frequency electric field power, gas flow rate, etc.). In order to dissociate gas to form plasmas, dry etching needs to be performed at a low air pressure (about 10 mTorr). The radio frequency electric field is classified into a source radio frequency electric field and a bias radio frequency electric field. The function of the source radio frequency electric field is to dissociate gas to form plasmas, which mainly contributes to chemical etching, and the etching rates of different film layers are significantly different. The function of the bias radio frequency electric field is to accelerate etching of the film layers by ions in the plasmas, which mainly contributes to physical etching, and the etching rates of different film layers are slightly different. The etching gas commonly used for inorganic films is $CF_4+O_2$ or $SF_6+O_2$. $CF_4+O_2$ brings slightly different etching rates for $SiN_x$ and $SiO_x$, but $SF_6+O_2$ brings a large etching rate for $SiN_x$ and a small etching rate for $SiO_x$ because $SF_6$ lacks the carbon element to react with the oxygen element in $SiO_x$. By utilizing this characteristic, the isolation wall in the embodiment of the present disclosure can be fabricated.

Figure 6:
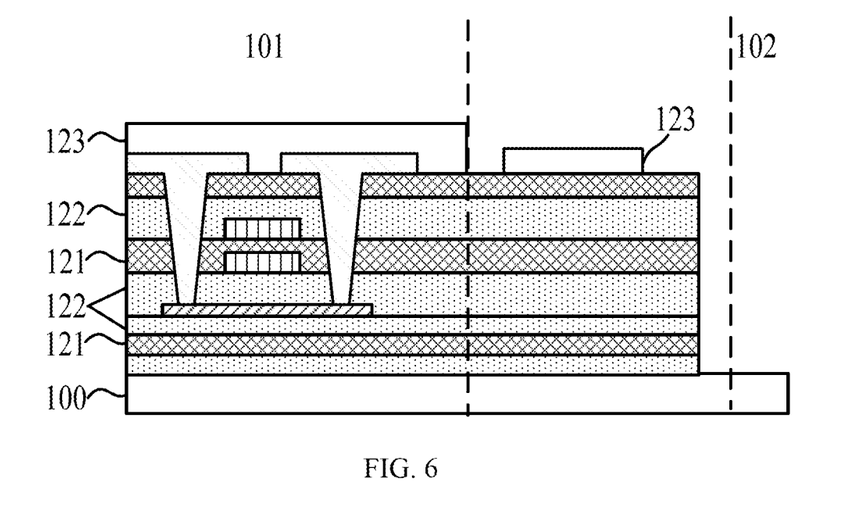
Figure 7:
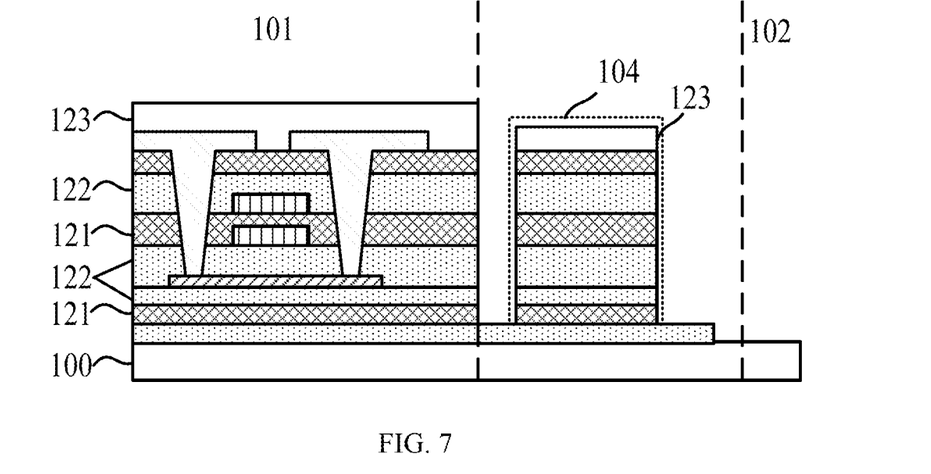

Prior to performing the etching process, a pre-etching process may be performed. A photoresist is used to form a protective layer pattern 123 above the structure shown in FIG. 5, as shown in FIG. 6. The protective layer pattern includes a first portion and a second portion, and there is a gap between the first portion and the second portion. The orthographic projection of the first portion on the base substrate covers the display region, and the orthographic projection of the second portion on the base substrate covers the orthographic projection of the isolation wall on the base substrate. A pre-etching process is then performed on a portion of $SiN_x$ corresponding to the boundary and a portion of $Si_x$ corresponding to the boundary, so as to form at least one prefabricated wall 104 extending along the boundary between the display region and the opening region, as shown in FIG. 7.

The pre-etching process may employ $CF_4+O_2$ as the etching gas. Typical pre-etching conditions may be: air pressure 10 mTorr, source RF power 18 Kw, bias RF power 18 Kw, gas flow rate $CF_4$ 720 sccm/$O_2$ 480 sccm. $CF_4+O_2$ causes a small difference between the etching rates for $SiN_x$ and $SiO_x$. The prefabricated wall 104 obtained under the aforementioned pre-etching conditions has a substantially flat first side surface and a substantially flat second side surface, as shown in FIG. 7. The pre-etching process can fully expose the side walls of $SiN_x$ and $SiO_x$, which is beneficial to the subsequent etching process.

Figure 8:
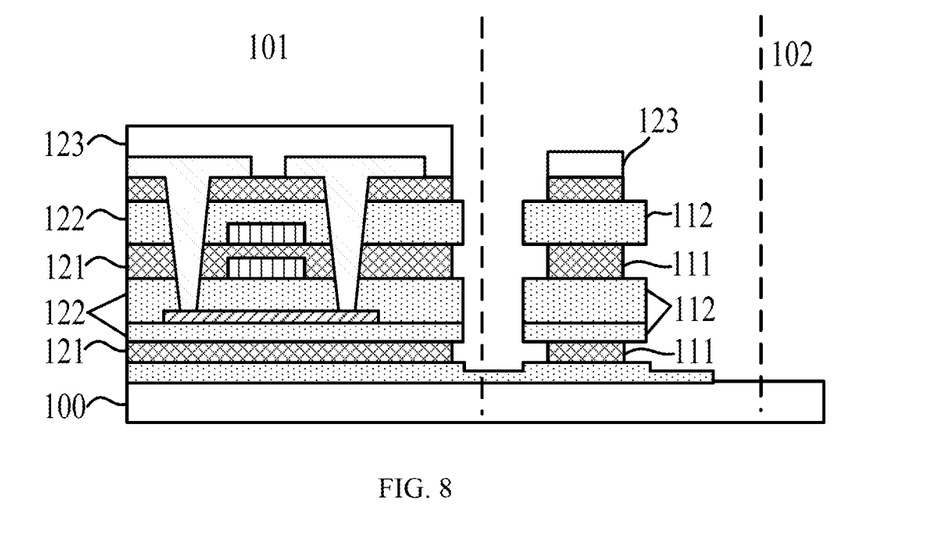

Next, $SF_6+O_2$ is used as the etching gas to perform the etching process. Typical etching conditions may be: air pressure 10 mTorr, source RF power 18 Kw, bias RF power 0 Kw, gas flow rate $SF_6$ 360 sccm/$O_2$ 800 sccm. The purpose of using 0 Kw as the bias RF power is to reduce physical etching. Basically etching $SiN_x$ only can be realized by utilizing significantly different chemical etching rates for $SiN_x$ and $SiO_x$. After performing the etching process on the portion of the $SiN_x$ layer corresponding to the boundary and the portion of the $SiO_x$ layer corresponding to the boundary simultaneously using such etching conditions, as shown in FIG. 8, the portion of the $SiN_x$ layer corresponding to the boundary is patterned as the first layer 111 of the isolation structure, and the portion of the $SiO_x$ layer corresponding to the boundary is patterned as the second layer 112 of the isolation structure.

Figure 9:
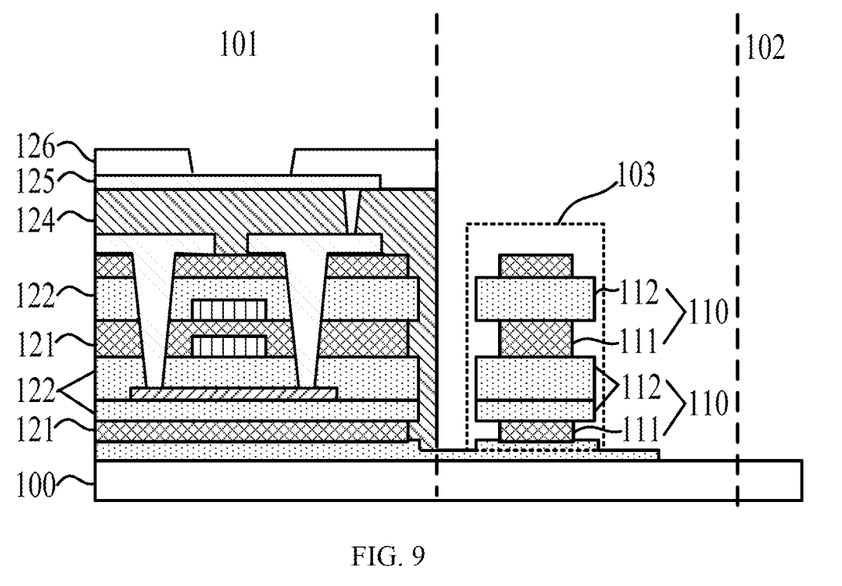

After performing the etching process, the method further includes: removing the protective layer pattern; fabricating a planarization layer 124, an anode layer 125, and a pixel definition layer 126 in the display region 101 of the display substrate, as shown in FIG. 9; and forming an organic light emitting material layer 127 on the display substrate, as shown in FIG. 3.

At present, evaporation of an organic light emitting material using a high precision metal mask is prone to bring a shadow effect. As a result, the organic light emitting material is also present in other regions of the display substrate in addition to the sub-pixel regions, and moisture in the opening region easily enters the display region through the passage of the organic light emitting material, resulting in poor display such as dark spots.

In the embodiments of the present disclosure, the isolation wall is fabricated using multiple dielectric layers stacked when fabricating the thin film transistor structure, without the need to prepare additional material layers to form the isolation wall, which reduces the process steps and simplifies the manufacturing procedure of the display substrate. When the organic light emitting material layer is being evaporated, the isolation structure can disconnect the organic light emitting material layer, so that the organic light emitting material layer is discontinuous on the side surface of the at least one isolation wall. In this way, the moisture passage is effectively blocked to prevent moisture from entering the display region via the organic light emitting material layer and causing deficiencies such as dark spots, thereby ensuring the display quality and increasing the product yield.

When the first material layer and the second material layer are made of other materials, suitable etching method and etching conditions may be selected as needed, which is not limited in the present disclosure.

Figure 10:
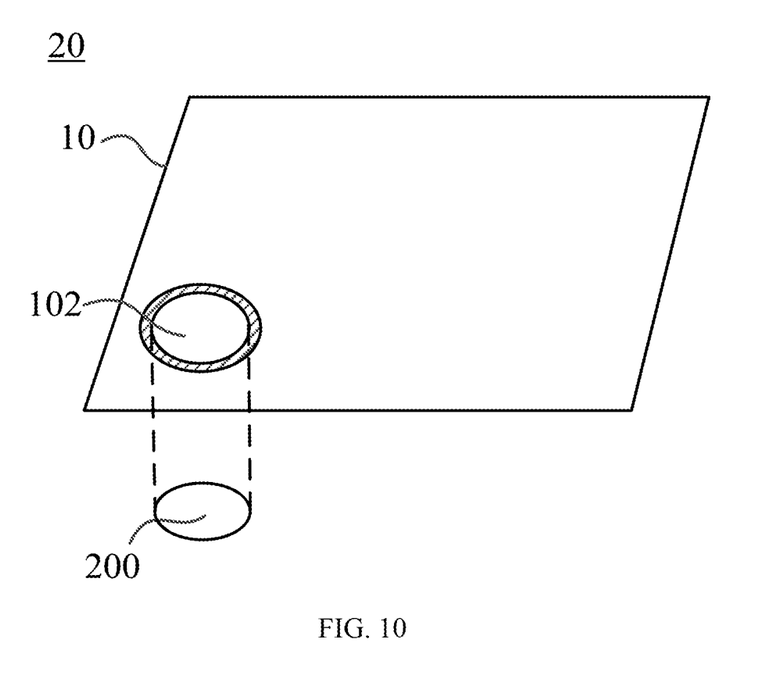
FIG. 10 is a schematic structural view of a display device according to an embodiment of the present disclosure.

According to another aspect of the present disclosure, there is further provided a display device. As shown in FIG. 10, the display device 20 includes the display substrate 10 described in any of the foregoing embodiments. The display device has the same beneficial effects as the display substrate provided in the foregoing embodiments, which will not be repeated here.

The display device 20 may further comprise a photosensitive element 200 corresponding to the opening region 102 of the display substrate 10. For example, the photosensitive element may be a camera. The display device may be any product or component with a display function, such as a mobile phone, a tablet computer, a smart photo frame, and the like.

For clarity, in the drawings used to describe the embodiments of the present disclosure, the thicknesses and sizes of layers or microstructures are exaggerated. It can be understood that when an element such as a layer, film, region or substrate is referred to as being located "above" or "below" another element, said element may be "directly" located "above" or "below" the other element, or there may be intermediate elements.

Unless otherwise defined, the technical terms used in the embodiments of the present disclosure should have common meanings understood by a person having an ordinary skill in the field to which the present disclosure pertains. The "first", "second" and similar words used in the embodiments of the present disclosure do not indicate any order, quantity or importance, but are only used to distinguish different components. The expression such as "upper", "lower", "left" or "right" is only used to indicate a relative positional relationship. When the absolute position of an object being described is changed, the relative positional relationship may also change accordingly.

What have been stated above are only specific embodiments of the present disclosure, but the protection scope of the present disclosure is not limited thereto. Any variations or substitutions that can be easily conceived by those skilled in the art familiar with this technical field within the technical scope revealed by the present disclosure should be encompassed within the protection scope of the present disclosure. Thus, the protection scope of the present disclosure should be based on the protection scope of the claims. By studying the drawings, the disclosure and the appended claims, a person having an ordinary skill in the art can understand and achieve other modifications to the disclosed embodiments when practicing the claimed invention. In the claims, the wording "comprising" does not exclude other elements or steps, and the terms such as "a", "an" and "the" in the singular do not exclude the plural. The mere fact that certain measures are recited in mutually different dependent claims does not indicate that a combination of these measures cannot be used to advantage. Any reference signs in the claims should not be construed as limiting the scope.

What is claimed is:

1. A display substrate, comprising:
   a base substrate, the base substrate comprising a display region and an opening region adjacent to each other; and
   at least one isolation wall extending along a boundary between the display region and the opening region;
   wherein each of the at least one isolation wall comprises at least one isolation structure, and each of the at least one isolation structure comprises:
   a first layer on a side of the base substrate; and
   a second layer on a side of the first layer away from the base substrate;
   and wherein an orthographic projection of the first layer on the base substrate is within an orthographic projection of the second layer on the base substrate, and the first layer and the second layer are inorganic dielectric layers.

2. The display substrate according to claim 1, wherein the display region comprises a thin film transistor structure, the thin film transistor structure being on a first material layer and a second material layer; the first layer is composed of a portion of the first material layer corresponding to the boundary, and the second layer is composed of a portion of the second material layer corresponding to the boundary.

3. The display substrate according to claim 2, wherein the first material layer and the second material layer have different etching properties.

4. The display substrate according to claim 3, wherein the first material layer is a $SiN_x$ layer, and the second material layer is a $SiO_x$ layer.

5. The display substrate according to claim 1, wherein each of the at least one isolation wall comprises at least two isolation structures stacked along a direction perpendicular to a surface of the base substrate.

6. The display substrate according to claim 1, further comprising an organic light emitting material layer, the organic light emitting material layer being discontinuous on a side surface of the at least one isolation wall.

7. A display device comprising the display substrate according to claim 1.

8. The display device according to claim 7, further comprising a photosensitive element, the photosensitive element corresponding to the opening region.

9. The display device according to claim 7, wherein the display region comprises a thin film transistor structure, the thin film transistor structure being on a first material layer and a second material layer; the first layer is composed of a portion of the first material layer corresponding to the boundary, and the second layer is composed of a portion of the second material layer corresponding to the boundary.

10. The display device according to claim 9, wherein the first material layer and the second material layer have different etching properties.

11. The display device according to claim 10, wherein the first material layer is a $SiN_x$ layer, and the second material layer is a $SiO_x$ layer.

12. The display device according to claim 7, wherein each of the at least one isolation wall comprises at least two isolation structures stacked along a direction perpendicular to a surface of the base substrate.

\* \* \* \* \*